(12) United States Patent
Van Gerpen

(10) Patent No.: US 9,076,963 B2
(45) Date of Patent: Jul. 7, 2015

(54) PHASE CHANGE MEMORY CELLS AND METHODS OF FORMING PHASE CHANGE MEMORY CELLS

(71) Applicant: Micron Technology, Inc., Boise, ID (US)

(72) Inventor: Damon E. Van Gerpen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/282,142

(22) Filed: May 20, 2014

(65) Prior Publication Data

US 2014/0252302 A1    Sep. 11, 2014

Related U.S. Application Data

(62) Division of application No. 13/460,356, filed on Apr. 30, 2012, now Pat. No. 8,765,555.

(51) Int. Cl.
*H01L 27/148* (2006.01)
*H01L 29/768* (2006.01)
(Continued)

(52) U.S. Cl.
CPC ............ *H01L 45/1286* (2013.01); *H01L 45/06* (2013.01); *H01L 45/1233* (2013.01); *H01L 45/141* (2013.01); *H01L 45/144* (2013.01); *H01L 45/1683* (2013.01); *H01L 27/2436* (2013.01); *H01L 27/2463* (2013.01)

(58) Field of Classification Search
CPC ............... H01L 21/043; H01L 21/048; H01L 21/76802; H01L 21/8229; H01L 27/0826; H01L 23/345; H01L 29/0649

USPC ............ 257/246, 248, 249, 247, 377, 4, 396, 257/576, 774, 757, E21.006, E21.014, 257/E21.062, E21.304, E21.32, E21.077, 257/E21.121, E21.267, E21.545, E21.546, 257/E21.548, E21.549

See application file for complete search history.

(56) References Cited

U.S. PATENT DOCUMENTS

| 4,752,118 A | 6/1988 | Johnson |
| 4,849,247 A | 7/1989 | Scanlon et al. |
| 4,987,099 A | 1/1991 | Flanner |

(Continued)

FOREIGN PATENT DOCUMENTS

| WO | WO 2010/073904 | 7/2010 |
| WO | PCT/US2012/063962 | 3/2013 |

(Continued)

OTHER PUBLICATIONS

U.S. Appl. No. 13/276,523, filed Oct. 19, 2011, Redaelli et al.

(Continued)

*Primary Examiner* — David Nhu
(74) *Attorney, Agent, or Firm* — Wells St. John, P.S.

(57) ABSTRACT

A phase change memory cell includes a first electrode having a cylindrical portion. A dielectric material having a cylindrical portion is longitudinally over the cylindrical portion of the first electrode. Heater material is radially inward of and electrically coupled to the cylindrical portion of the first electrode. Phase change material is over the heater material and a second electrode is electrically coupled to the phase change material. Other embodiments are disclosed, including methods of forming memory cells which include first and second electrodes having phase change material and heater material in electrical series there-between.

22 Claims, 4 Drawing Sheets

(51) Int. Cl.
*H01L 45/00* (2006.01)
*H01L 27/24* (2006.01)

(56) References Cited

U.S. PATENT DOCUMENTS

| | | | |
|---|---|---|---|
| 5,055,423 | A | 10/1991 | Smith et al. |
| 5,166,758 | A | 11/1992 | Ovshinsky et al. |
| 5,895,963 | A | 4/1999 | Yamasaki |
| 5,912,839 | A | 6/1999 | Ovshinsky et al. |
| 6,143,670 | A | 11/2000 | Cheng et al. |
| 6,611,453 | B2 | 8/2003 | Ning |
| 6,613,604 | B2 | 9/2003 | Maimon et al. |
| 6,661,330 | B1 | 12/2003 | Young |
| 6,664,182 | B2 | 12/2003 | Jeng |
| 6,692,898 | B2 | 2/2004 | Ning |
| 6,700,211 | B2 | 3/2004 | Gonzalez et al. |
| 6,764,894 | B2 | 7/2004 | Lowrey |
| 6,815,704 | B1 | 11/2004 | Chen |
| 7,148,140 | B2 | 12/2006 | Leavy et al. |
| 7,169,624 | B2 | 1/2007 | Hsu |
| 7,332,401 | B2 | 2/2008 | Moore et al. |
| 7,422,926 | B2 | 9/2008 | Pellizzer et al. |
| 7,453,111 | B2 | 11/2008 | Ryoo et al. |
| 7,619,933 | B2 | 11/2009 | Sarin |
| 7,638,787 | B2 | 12/2009 | An et al. |
| 7,646,631 | B2 | 1/2010 | Lung |
| 7,719,039 | B2 | 5/2010 | Muralidhar et al. |
| 7,772,680 | B2 | 8/2010 | Manning |
| 7,773,413 | B2 | 8/2010 | Shalvi |
| 7,785,978 | B2 * | 8/2010 | Smythe ............... 438/382 |
| 7,800,092 | B2 | 9/2010 | Liu et al. |
| 7,803,655 | B2 | 9/2010 | Johnson et al. |
| 7,838,341 | B2 | 11/2010 | Dennison |
| 7,867,832 | B2 | 1/2011 | Yang et al. |
| 7,888,711 | B2 | 2/2011 | Cheung et al. |
| 7,915,602 | B2 * | 3/2011 | Sato .................... 257/4 |
| 7,919,766 | B2 | 4/2011 | Lung |
| 7,935,553 | B2 | 5/2011 | Scheuerlein et al. |
| 7,974,115 | B2 | 7/2011 | Jeong et al. |
| 8,013,319 | B2 | 9/2011 | Chang |
| 8,110,822 | B2 | 2/2012 | Chen |
| 8,614,433 | B2 | 12/2013 | Lee et al. |
| 8,765,555 | B2 * | 7/2014 | Van Gerpen ......... 438/270 |
| 8,822,969 | B2 | 9/2014 | Hwang |
| 2002/0017701 | A1 | 2/2002 | Klersy et al. |
| 2002/0173101 | A1 | 11/2002 | Shau |
| 2002/0177292 | A1 | 11/2002 | Dennison |
| 2004/0178425 | A1 | 9/2004 | Kato |
| 2005/0006681 | A1 | 1/2005 | Okuno |
| 2005/0110983 | A1 | 5/2005 | Jeong et al. |
| 2006/0073652 | A1 | 4/2006 | Pellizzer et al. |
| 2006/0076548 | A1 | 4/2006 | Park et al. |
| 2006/0113520 | A1 | 6/2006 | Yamamoto et al. |
| 2006/0157682 | A1 | 7/2006 | Scheurlein |
| 2006/0186440 | A1 | 8/2006 | Wang et al. |
| 2006/0284279 | A1 | 12/2006 | Lung et al. |
| 2006/0286709 | A1 | 12/2006 | Lung et al. |
| 2007/0012905 | A1 | 1/2007 | Huang |
| 2007/0029676 | A1 | 2/2007 | Takaura et al. |
| 2007/0054486 | A1 | 3/2007 | Yang |
| 2007/0075347 | A1 | 4/2007 | Lai et al. |
| 2007/0075359 | A1 | 4/2007 | Yoon et al. |
| 2007/0108431 | A1 | 5/2007 | Chen et al. |
| 2007/0158698 | A1 | 7/2007 | Dennison et al. |
| 2007/0224726 | A1 | 9/2007 | Chen et al. |
| 2007/0235708 | A1 | 10/2007 | Elmgreen et al. |
| 2007/0279974 | A1 | 12/2007 | Dennison et al. |
| 2008/0043520 | A1 | 2/2008 | Chen |
| 2008/0054470 | A1 | 3/2008 | Amano et al. |
| 2008/0067485 | A1 | 3/2008 | Besana et al. |
| 2008/0067486 | A1 | 3/2008 | Karpov et al. |
| 2008/0093703 | A1 | 4/2008 | Yang et al. |
| 2008/0105862 | A1 | 5/2008 | Lung et al. |
| 2008/0128677 | A1 | 6/2008 | Park et al. |
| 2008/0137400 | A1 | 6/2008 | Chen et al. |
| 2008/0138929 | A1 | 6/2008 | Lung |
| 2008/0157053 | A1 | 7/2008 | Lai et al. |
| 2008/0197394 | A1 | 8/2008 | Caspary et al. |
| 2009/0008621 | A1 | 1/2009 | Lin et al. |
| 2009/0017577 | A1 | 1/2009 | An et al. |
| 2009/0032794 | A1 | 2/2009 | Hsiao |
| 2009/0039333 | A1 | 2/2009 | Chang et al. |
| 2009/0072213 | A1 | 3/2009 | Elmgreen et al. |
| 2009/0072341 | A1 | 3/2009 | Liu et al. |
| 2009/0091971 | A1 | 4/2009 | Dennison et al. |
| 2009/0101883 | A1 | 4/2009 | Lai et al. |
| 2009/0108247 | A1 | 4/2009 | Takaura et al. |
| 2009/0115020 | A1 | 5/2009 | Yang et al. |
| 2009/0127538 | A1 | 5/2009 | Ryoo et al. |
| 2009/0147564 | A1 | 6/2009 | Lung |
| 2009/0194757 | A1 | 8/2009 | Lam et al. |
| 2009/0194758 | A1 | 8/2009 | Chen |
| 2009/0230505 | A1 | 9/2009 | Dennison |
| 2009/0298222 | A1 | 12/2009 | Lowrey et al. |
| 2009/0302300 | A1 | 12/2009 | Chang et al. |
| 2009/0321706 | A1 | 12/2009 | Happ et al. |
| 2010/0001248 | A1 | 1/2010 | Wouters et al. |
| 2010/0001253 | A1 | 1/2010 | Arnold et al. |
| 2010/0019221 | A1 | 1/2010 | Lung et al. |
| 2010/0054029 | A1 | 3/2010 | Happ et al. |
| 2010/0055830 | A1 | 3/2010 | Chen et al. |
| 2010/0065530 | A1 | 3/2010 | Walker et al. |
| 2010/0072447 | A1 | 3/2010 | Lung |
| 2010/0072453 | A1 | 3/2010 | Jeong et al. |
| 2010/0107403 | A1 | 5/2010 | Aubel et al. |
| 2010/0151652 | A1 | 6/2010 | Lung et al. |
| 2010/0163830 | A1 | 7/2010 | Chang et al. |
| 2010/0163833 | A1 | 7/2010 | Borghi et al. |
| 2010/0165719 | A1 | 7/2010 | Pellizzer |
| 2010/0176368 | A1 | 7/2010 | Ko et al. |
| 2010/0176911 | A1 | 7/2010 | Park et al. |
| 2010/0207168 | A1 | 8/2010 | Sills et al. |
| 2010/0213431 | A1 | 8/2010 | Yeh et al. |
| 2010/0221874 | A1 | 9/2010 | Kuo et al. |
| 2010/0270529 | A1 | 10/2010 | Lung |
| 2010/0301303 | A1 | 12/2010 | Wang et al. |
| 2010/0301304 | A1 | 12/2010 | Chen et al. |
| 2010/0301417 | A1 | 12/2010 | Cheng et al. |
| 2010/0308296 | A1 | 12/2010 | Pirovano et al. |
| 2010/0323490 | A1 | 12/2010 | Sreenivasan et al. |
| 2010/0327251 | A1 | 12/2010 | Park |
| 2011/0001114 | A1 | 1/2011 | Zanderighi et al. |
| 2011/0031461 | A1 | 2/2011 | Kang et al. |
| 2011/0074538 | A1 | 3/2011 | Wu et al. |
| 2011/0092041 | A1 | 4/2011 | Lai et al. |
| 2011/0155984 | A1 | 6/2011 | Redaelli et al. |
| 2011/0193042 | A1 | 8/2011 | Maxwell |
| 2011/0193049 | A1 | 8/2011 | Iwakaji et al. |
| 2011/0215436 | A1 | 9/2011 | Tang et al. |
| 2011/0284815 | A1 | 11/2011 | Kim et al. |
| 2011/0300685 | A1 | 12/2011 | Horii et al. |
| 2011/0312178 | A1 | 12/2011 | Watanabe et al. |
| 2012/0241705 | A1 | 9/2012 | Bresolin et al. |
| 2013/0277796 | A1 | 10/2013 | Yang et al. |

FOREIGN PATENT DOCUMENTS

| | | |
|---|---|---|
| WO | WO 2013/039496 | 3/2013 |
| WO | PCT/US2012/063962 | 5/2014 |
| WO | PCT/US2014/011250 | 5/2014 |

OTHER PUBLICATIONS

U.S. Appl. No. 13/298,722, filed Nov. 17, 2011, Redaelli et al.
U.S. Appl. No. 13/298,840, filed Nov. 17, 2011, Tang et al.
U.S. Appl. No. 13/298,962, filed Nov. 17, 2011, Pellizzer et al.
U.S. Appl. No. 13/460,302, filed Apr. 30, 2012, Van Gerpen et al.
U.S. Appl. No. 13/460,356, filed Apr. 30, 2012, Van Gerpen.
U.S. Appl. No. 13/666,744, filed Nov. 1, 2012, Goswami.
U.S. Appl. No. 13/761,570, filed Feb. 7, 2013, Liu et al.
Bez; Chalcogenide PCM: a Memory Technology for Next Decade; IEEE, 2009, pp. 5.1.1.5.1.4.

(56) References Cited

OTHER PUBLICATIONS

Czubatyj et al., "Current Reduction in Ovonic Memory Devices", downloaded from www.epcos.org/library/papers/pdC2006/pdf.../Czubatyj.pdf; prior Nov. 17, 2011.
Fazio, "Future Directions of Non-Volatile Memory in Compute Applications", IEEE, 2009, pp. 27.7.1-7 27,7.4.
Happ et al., "Novel One-Mask Self-Heating Pillar Phase Change Memory", IEEE, 2006 Symposium on 5 VLSI Technology Digest of Technical Papers; 2 pp.
Lee et al.; Programming Disturbance and Cell Scaling in Phase Change Memory: For up to 16nm based 4F2 Cell; IEEE, 2010 Symposium on VLSI Technology Digest ofTechnical Papers, pp. 199-200.
Raoux et al., Effect of Ion Implantation on Crystallization Properties of Phase Change Materials, presented at E\PCOS201 0 Conference, Sep. 6-7, 2010, Politecnico di Milano, Milan, Italy.
Russo et al.; Modeling of Programming and Read Performance in Phase-Change Memories—Part II: Program Disturb and Mixed-Scaling Approach,. IEEE Transactions on Electron Devices, vol. 55(2), Feb. 2008, pp. 5.15-5.22.
Servalli; A 45nm Generation Phase Change Memory Technology; IEEE 2009; pp. IEDM09-113-116.
Villa et al.; A 45nm 1Gb 1.8V Phase-Change Memory; 2010 IEEE International Solid-State Circuits Conference; Feb. 9, 2010; pp. 270-271.
U.S. Appl. No. 14/295,770, filed Jun. 4, 2014, Pellizzer.
U.S. Appl. No. 14/242,588, filed Apr. 1, 2014, Lindenberg.
U.S. Appl. No. 14/293,577, filed Jun. 2, 2014, Pellizzer et al.

\* cited by examiner

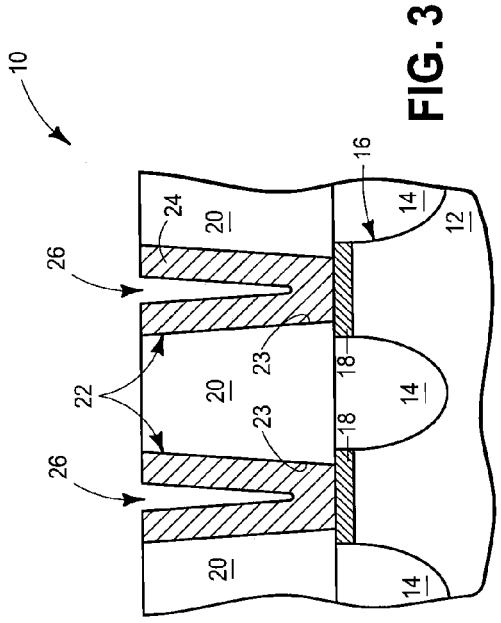
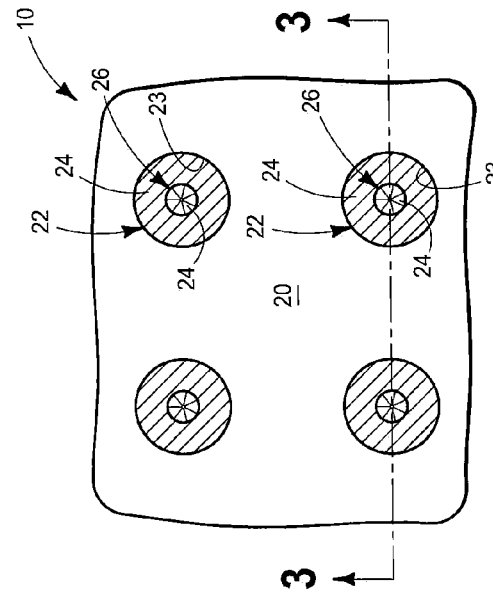
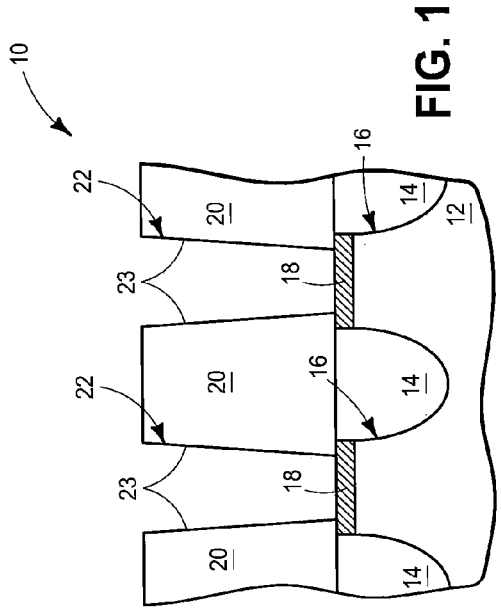
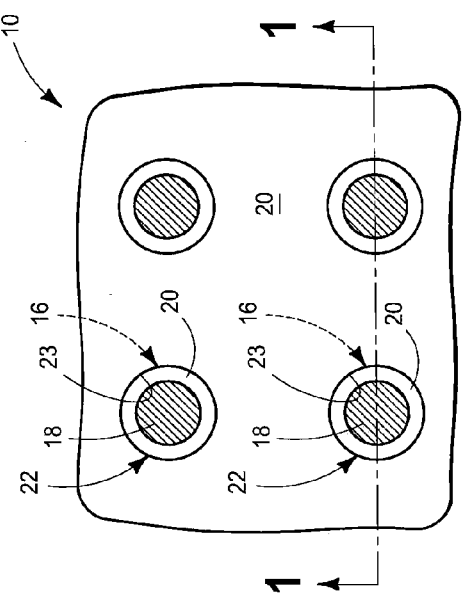

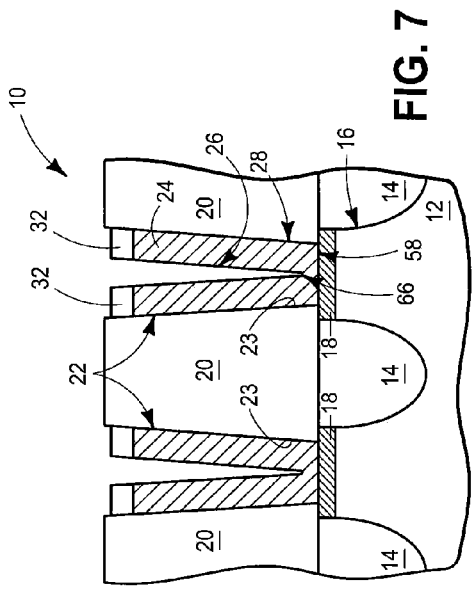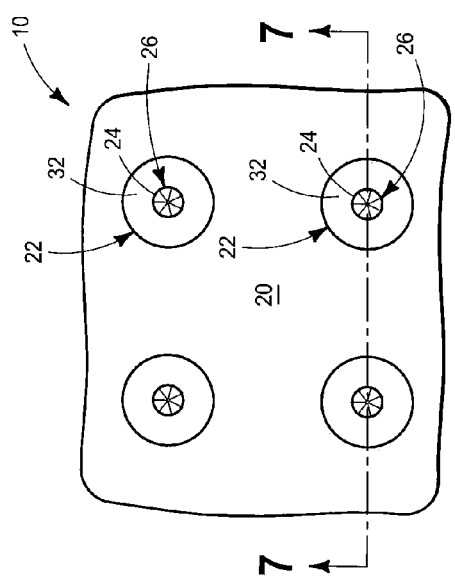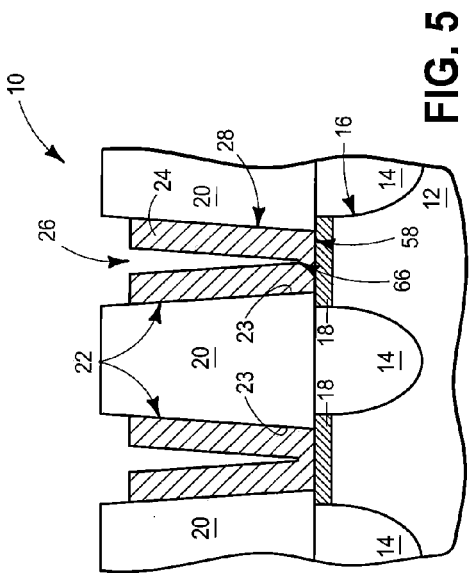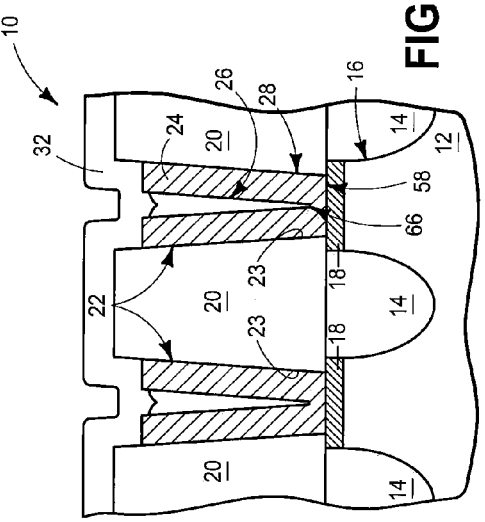

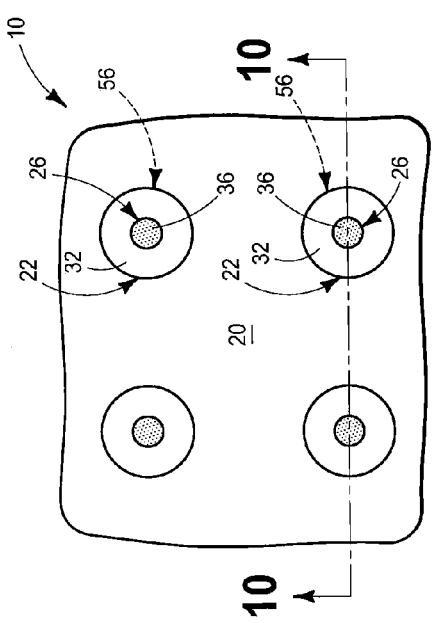
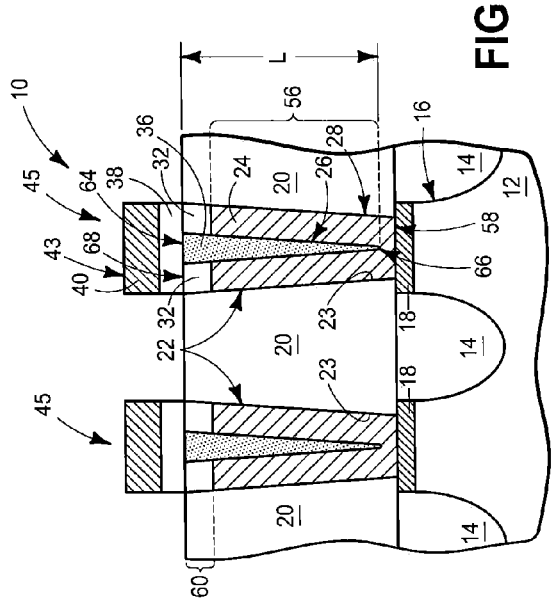
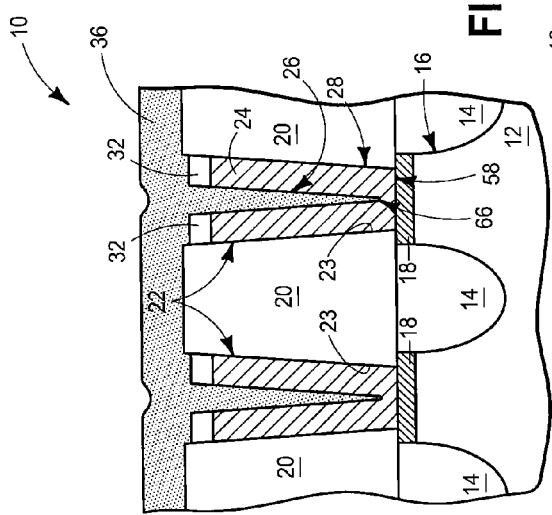
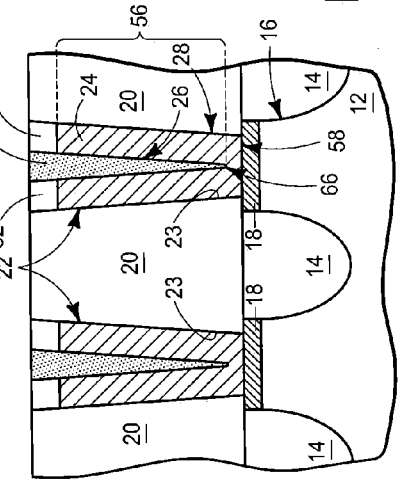

PHASE CHANGE MEMORY CELLS AND METHODS OF FORMING PHASE CHANGE MEMORY CELLS

RELATED PATENT DATA

This patent resulted from a divisional application from U.S. patent application Ser. No. 13/460,356, filed Apr. 30, 2012, now U.S. Pat. No. 8,765,555, entitled "Phase Change Memory Cells And Methods Of Forming Phase Change Memory Cells", naming Damon E. Van Gerpen as inventor, the disclosure of which is incorporated by reference.

TECHNICAL FIELD

Embodiments disclosed herein pertain to phase change memory cells and to methods of forming phase change memory cells.

BACKGROUND

Memory is one type of integrated circuitry, and may be used in electronic systems for storing data. Memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information. The stored memory may be non-volatile wherein the memory state is maintained for a considerable period of time and in many instances where power is completely removed from the circuitry. Alternately, the memory may be volatile, requiring to be refreshed (i.e., rewritten), and in many instances multiple times per second.

One type of non-volatile memory is a phase change memory cell. Such memories use a reversibly programmable material that has the property of switching between two different phases, for example between an amorphous, disorderly phase and a crystalline or polycrystalline, orderly phase. The two phases may be associated with resistivities of significantly different values. Presently, typical phase change materials are chalcogenides, although other materials may be developed. With chalcogenides, the resistivity may vary by two or more orders of magnitude when the material passes from the amorphous (more resistive) phase to the crystalline (more conductive) phase, and vice-versa. Phase change can be obtained by locally increasing the temperature of the chalcogenide. Below 150° C., both phases are stable. Starting from an amorphous state and rising to temperature above about 400° C., a rapid nucleation of the crystallites may occur and, if the material is kept at the crystallization temperature for a sufficiently long time, it undergoes a phase change to become crystalline. Reversion to the amorphous state can result by raising the temperature above the melting temperature (about 600° C.) followed by cooling.

In phase change memory, a plurality of memory cells is typically arranged in rows and columns to form an array or sub-array. Each memory cell is coupled to a respective select or access device which may be implemented by any switchable device, such as a PN diode, a bipolar junction transistor, a field effect transistor, etc. The access device is often electrically coupled with, or forms a part of, what is referred to as an access line or word line. A resistive electrode is electrically coupled with the switchable device, and comprises heater material which is configured to heat up upon sufficient current flowing there-through. The phase change material is provided in proximity to the heater material, thereby forming a programmable storage element. The crystallization temperature and the melting temperature are obtained by causing an electric current to flow through the heater material, thus heating the phase change material. An electrode, typically referred to as a bit, digit, or select line, is electrically coupled to the phase change material.

BRIEF DESCRIPTION OF THE DRAWINGS

FIG. 1 is a diagrammatic structural cross-section view of a substrate fragment in process in accordance with an embodiment of the invention, and is taken through line 1-1 in FIG. 2.

FIG. 2 is a diagrammatic top plan view of the substrate fragment of FIG. 1.

FIG. 3 is a view of the FIG. 1 substrate fragment at a processing step subsequent to that shown by FIG. 1, and is taken through line 3-3 in FIG. 4.

FIG. 4 is a top plan view of the substrate fragment of FIG. 3.

FIG. 5 is a view of the FIG. 3 substrate fragment at a processing step subsequent to that shown by FIG. 3.

FIG. 6 is a view of the FIG. 5 substrate fragment at a processing step subsequent to that shown by FIG. 5.

FIG. 7 is a view of the FIG. 6 substrate fragment at a processing step subsequent to that shown by FIG. 6, and is taken through line 7-7 in FIG. 8.

FIG. 8 is a top plan view of the substrate fragment of FIG. 7.

FIG. 9 is a view of the FIG. 7 substrate fragment at a processing step subsequent to that shown by FIG. 7.

FIG. 10 is a view of the FIG. 9 substrate fragment at a processing step subsequent to that shown by FIG. 9, and is taken through line 10-10 in FIG. 11.

FIG. 11 is a top plan view of the substrate fragment of FIG. 10.

FIG. 12 is a view of the FIG. 10 substrate fragment at a processing step subsequent to that shown by FIG. 10, and is taken through line 12-12 in FIG. 13.

DETAILED DESCRIPTION OF EXAMPLE EMBODIMENTS

Figure 13:
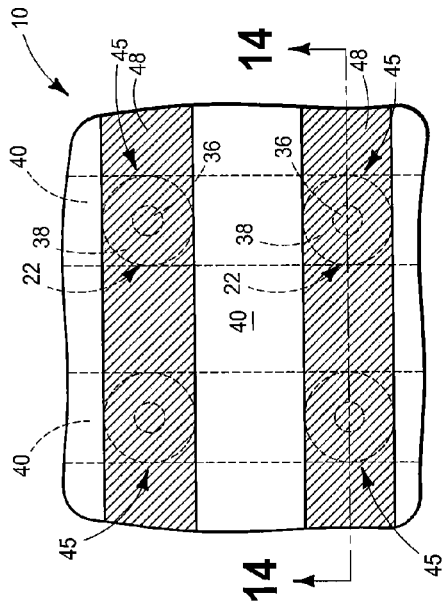
FIG. 13 is a top plan view of the substrate fragment of FIG. 12.

Example methods of forming a memory cell in accordance with some embodiments of the invention are initially described with reference to FIGS. 1-15. Embodiments of the invention also encompass phase change memory cells independent of method of manufacture.

Referring to FIGS. 1 and 2, a substrate fragment 10 comprises a base substrate 12. Substrate 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate material 12 may be homogenous or non-homogenous, for example comprising multiple different composition materials and/or layers. As an example, substrate material 12 may comprise bulk-monocrystalline silicon and/or a semiconductor-on-insulator substrate.

Dielectric isolation regions 14 have been formed within substrate material 12 whereby example islands or pillar-like regions 16 comprising semiconductor material 12 have been formed. The dielectric material of regions 14 may be homogenous or non-homogenous, with silicon nitride and doped or undoped silicon dioxide being examples. Highly conductive contact regions 18 have been formed atop or as part of islands 16. Example materials for regions 18 are refractory metal silicides, such as cobalt silicide. Material 12 may comprise suitable type and concentration conductivity enhancing dopant(s) formed in a suitable pattern whereby regions 18 and material 12 in combination comprise at least part of individual select devices for reading, writing, and erasing individual memory cells. Example select devices include buried junction transistors, although other existing or yet-to-be-developed devices may be used, and which are not particularly material to the inventive aspects disclosed herein.

An insulator material (i.e., dielectric material) 20 has been formed as part of substrate 10. Such may be homogenous or non-homogenous, with silicon nitride and doped or undoped silicon dioxide being examples. Openings 22 extend through material 20 to regions 18. For purposes of the continuing discussion, openings 22 may be considered as having sidewalls 23 and in some embodiments openings 22 may be considered as first openings. Sidewalls 23 may be straight and/or curved, and regardless may taper radially inward moving elevationally into substrate 10 as shown. Openings 22 may be of circular or other shape in horizontal cross-section. As examples only, openings 22 may be oval, elliptical, straight and/or curve-sided, and in the form of elongated trenches running into and out of the plane of the page upon which FIG. 1 lies. Further and only as examples, openings 22 may have respective minimum horizontal opening dimensions at the outermost surface of material 20 from about 50 nanometers to about 60 nanometers. The figures for convenience and clarity in the drawings show openings 22 as being of the same size and shape as, and aligned with, the elevationally outermost surfaces of islands 16 and regions 18. Alternate shapes and alignments may be used. Individual phase change memory cells will be fabricated with respect to individual of openings 22 in the fabrication of an array of phase change memory cells. For convenience, the discussion largely proceeds with respect to fabrication of a single phase change memory cell, although thousands or millions of such memory cells will likely be fabricated at the same time.

Referring to FIGS. 3 and 4, sidewalls 23 of individual first openings 22 have been lined with conductive (i.e., electrically conductive) material 24 which will comprise an individual first electrode of a phase change memory cell that is being formed. Conductive material 24 may be homogenous or non-homogenous, and may comprise any one or more of an elemental metal, an alloy of two or more elemental metals, a conductive metal compound, and conductively doped semiconductive material. One specific example is elemental tungsten. In one embodiment, conductive material 24 may form a second opening 26 within first opening 22. Regardless, example manners of forming conductive material 24 within opening 22 include one or more of blanket physical vapor deposition, chemical vapor deposition, and atomic layer deposition, followed by polish or etch-back of the deposited conductive material at least to the elevationally outermost surface of insulator material 20. An example thickness for conductive material 24 above insulator material 20, and thereby lateral thickness of conductive material 24 at least proximate the elevationally outermost portion of opening 22, is about 20 nanometers. This leaves an example maximum horizontal opening cross-dimension of opening 26 to be about 15 nanometers for a 55 nanometer opening 22. Other dimensions may of course be used.

Referring to FIG. 5 and in one embodiment, conductive material 24 has been longitudinally recessed within opening 22, forming in one example a first electrode 28 of the memory cell which is being formed. Example techniques of longitudinally recessing include etching conductive material 24, for example by conducting a dry or wet etch. The longitudinal recessing may also remove some of the thickness of conductive material 24 from within second opening 26 over conductive region 18, for example as shown. In such event, the longitudinally recessing may remove sufficient conductive material 24 to expose conductive region 18 (not shown in FIG. 5).

Referring to FIG. 6, dielectric material 32 has been deposited to line sidewalls 23 of opening 22 longitudinally outward of recessed conductive material 24. Dielectric material 32 may be homogenous or non-homogenous, with silicon dioxide and silicon nitride being examples. Dielectric material 32 may be deposited to the same thickness as conductive material 34 or to a different thickness. In one embodiment, dielectric material 32 forms a bridge over remaining second opening 26 in conductive material 24, and in one embodiment occludes remaining second opening 26 in conductive material 24. Dielectric material 32 may or may not be received within second opening 26 and, regardless, in one embodiment may leave a void space within the remaining second opening 26 beneath a bridge that is formed. In one embodiment and as shown, dielectric material is deposited to within but does not completely fill remaining volume of second opening 26. Alternately but less ideal, dielectric material 32 may completely fill remaining volume of second opening 26 whereby no void space is formed (not shown). In one embodiment, dielectric material 32 is deposited directly against conductive material 24. In this document, a material or structure is "directly against" another when there is at least some physical touching contact of the stated materials or structures relative one another. In contrast, "over", "on", and "against" not proceeded by "directly", encompass "directly against" as well as constructions where intervening material(s) or structure(s) result(s) in no physical touching contact of the stated materials or structures relative one another.

Referring to FIGS. 7 and 8, dielectric material 32 has been removed within opening 22 to uncover remaining second opening 26 and leave dielectric material 32 in first opening 22 longitudinally over recessed conductive material 24. An example removing technique includes dry etching. In one embodiment and as shown, dielectric material 32 is completely removed within first opening 22 from being anywhere received within second opening 26. Alternately, some of dielectric material 32 may remain within second opening 26 (not shown), for example being received in at least a lower portion of remaining second opening 26 when dielectric material 32 was initially there-deposited. FIG. 7 shows removal of dielectric material 32 inward to have an elevationally outermost surface which is elevationally inward from that of insulator material 20. Alternately by way of examples, removal of dielectric material 32 may be inward to be elevationally coincident with the elevationally outermost surface of insulator material 20 or to be elevationally outward thereof.

Referring to FIG. 9, heater material 36 has been deposited into first opening 22 radially inward of dielectric material 32 and into remaining second opening 26 radially inward of and electrically coupled to conductive material 24 that is within first opening 22. In one embodiment and as shown, heater material 36 is formed directly against conductive material 24 and directly against dielectric material 32. In one embodiment and as shown, heater material 36 completely fills remaining volume of second opening 26 in conductive material 24, and in one embodiment as shown completely fills remaining volume of first opening 22 and in one embodiment overfills such remaining volume. Heater material 36 may be homogenous or non-homogenous, with TiSiN-based materials being examples. Heater material 36 may be formed directly against sidewalls 23 of opening 22, for example as shown where dielectric material 32 has been removed elevationally inward sufficiently to expose such sidewalls. Alternately, heater material 36 may not be formed directly against sidewalls 23 (not shown), for example if the elevationally/longitudinally outermost surface of dielectric material 32 is elevationally coincident with or outward of insulator material 20.

Referring to FIGS. 10 and 11, heater material 36 has been removed inwardly at least to the elevationally outermost surface of insulator material 20. As shown, heater material 36 has also been removed elevationally inward at least to the elevationally outermost surface of dielectric material 32, thereby removing some of dielectric material 20. Regardless, example techniques include chemical mechanical polishing and chemical etch-back.

Referring to FIGS. 12 and 13, phase change material 38 has been formed over heater material 36 and conductive (i.e., electrically conductive) second electrode material 40 has been formed which electrically couples to phase change material 38. Phase change material 38 and conductive second electrode material 40 may, respectively, be homogenous or non-homogenous. Second electrode material 40 may be of the same or different composition from that of conductive material 24 of first electrode 28. A specific example conductive second electrode material 40 comprises a composite of an elemental copper layer over an elemental tungsten layer over an elemental titanium layer. By way of example only, example phase change materials include chalcogenides, such as GeSbTe-based materials. Regardless, FIG. 12 depicts example individual memory cells 45 as comprising respective first electrodes 28 and second electrodes 43 having phase change material 38 and heater material 36 there-between (i.e., in series electrical connection between electrodes 28 and 43).

Second electrodes 43 in the depicted example are shown as being common along a column of memory cells 45, although other constructions may be used. Phase change material 38 may be of the same shape and outline as second electrode material 40 (as shown). Alternately as another example, the phase change material may be patterned such that it is not continuous between adjacent memory cells in the depicted columns (not shown). Further, the processing shown by FIGS. 9-13 shows heater material 36 being removed back at least to material 20 prior to depositing either of materials 38 and 40. Alternately by way of examples only, material 38 or materials 38 and 40 may be deposited prior to any removal action occurring with respect to heater material 36.

Figure 14:
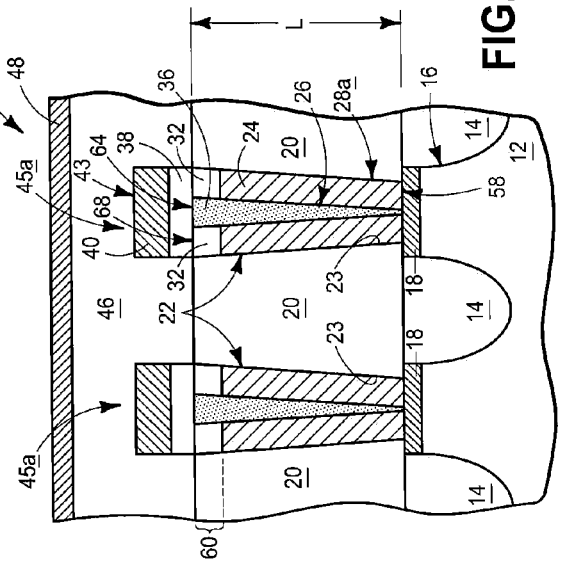
FIG. 14 is a view of the FIG. 12 substrate fragment at a processing step subsequent to that shown by FIG. 12, and is taken through line 14-14 in FIG. 15.
Figure 15:
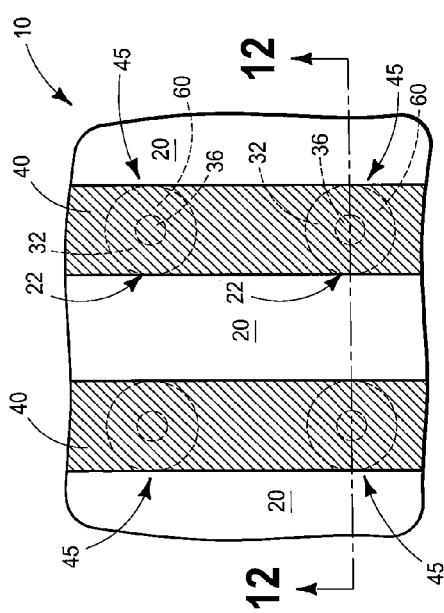
FIG. 15 is a top plan view of the substrate fragment of FIG. 14.

Referring to FIGS. 14 and 15, dielectric 46 has been formed over memory cells 45, and word or access lines 48 have been formed over dielectric 46. Materials 46 and 48, respectively, may be homogenous or non-homogenous, and may be of the same or different composition from other respective dielectric and conductive materials referred to above. Word or access lines 48 may connect portions of access devices, for example buried junction transistors, along respective rows as-shown. For example, substrate material 12 immediately beneath individual conductive regions 18 may in combination form part of an individual access device for a given memory cell 45. That substrate material 12 may be patterned or formed to be continuous along rows of individual memory cells and access/word lines 48 may be formed thereover. Other constructions may be used.

Method embodiments of the invention include forming a memory cell comprising first and second electrodes having phase change material and heater material there-between (i.e., in electrical series connection between the first and second electrodes). Some example methods in accordance with the invention include the lining of elevationally or longitudinally inner sidewalls of an opening with conductive material to comprise the first electrode of the memory cell. The opening may be formed within dielectric material. The above described processing through FIG. 3, or through FIGS. 4 and 5, are but examples of lining inner sidewalls of an opening with conductive material to comprise a first electrode of the memory cell.

Elevationally or longitudinally outer sidewalls of the opening are lined with dielectric material. The conductive material may or may not be longitudinally recessed prior to lining the outer sidewalls of the opening with dielectric material. The processing described above with respect to FIGS. 6-8 are but examples of techniques of lining outer sidewalls of the opening with dielectric material.

Heater material is formed in the opening laterally inward of and electrically coupled to the conductive material in the opening. In one embodiment, the heater material is also formed in the opening laterally inward of the dielectric material. Regardless, in one embodiment the heater material is formed to fill a remaining of the volume of the opening laterally inward of the conductive material with the heater material. The heater material may be formed to overfill the remaining volume of the opening. Regardless, the heater material may be formed directly against the conductive material. Any of the attributes described above with respect to the processing through FIG. 11 may be used and constitute but examples of forming heater material in an opening that is at least laterally inward of and electrically coupled to the conductive material within the opening that comprises the first electrode.

In one embodiment, the conductive material comprises a cylindrical portion received about the heater material in the opening at the conclusion of forming the heater material in the opening. In one embodiment, the cylindrical portion completely encircles the heater material. For example with respect to the construction of FIGS. 10 and 11, conductive material 24 includes a cylindrical portion 56 received about heater material 36 within opening 22, and which in one embodiment completely encircles heater material 36. The embodiment of FIGS. 10 and 11 shows example cylindrical portion 56 as tapering elevationally and radially inward. However, other constructions may be used. For example, elevationally outward and/or radially outward tapering (not shown), or non-tapering cylindrical portions (not shown), may be used. Regardless, a "cylindrical portion" as used herein need not be in the form of a circle (i.e., it could be of other polygonal shape), and regardless need not completely encircle material about which such is received.

Some method embodiments of forming a memory cell include partially filling an opening in an insulator material with conductive material to comprise the first electrode of the memory cell, for example regardless of whether some or all of the sidewalls of such an opening is lined with conductive material. Remaining volume of the opening is partially filled with dielectric material over the conductive material, for example regardless of whether outer sidewalls of the opening are lined with the dielectric material. After partially filling the opening with the dielectric material, heater material is formed in the opening directly against the conductive material in the opening and directly against the dielectric material in the opening. Phase change material is formed over the heater material and conductive second electrode material is formed which electrically couples to the phase change material. Any one or combination of more than one of the above attributes may be used.

A method embodiment of the invention includes circumferentially self-aligning heater material within an opening within the first electrode, forming the phase change material over the heater material, and forming conductive second electrode material that is electrically coupled to the phase change material. In the context of this document, "self-aligned" means a technique whereby at least a lateral surface of a structure is defined by deposition of material against a sidewall of a previously patterned structure. In the context of this document, "circumferentially self-aligned" is a self-aligned technique whereby all lateral surfaces of a structure are defined by deposition of material against an encircling sidewall of a previously patterned structure. The above example embodiments described at least through FIG. 10 are examples. The method may reduce a mask step where, for example, a dedicated mask step was used in the prior art for patterning the heater material.

Embodiments of the invention also encompass phase change memory cells independent of method of fabrication. Yet, such phase change memory cells may have any one or more than one of the attributes described above with respect to method and/or structure. Further, embodiments of the invention encompass methods of fabricating any of the below described phase change memory cells.

Referring to FIGS. 12 and 13, an example phase change memory cell 45 in accordance with one example embodiment of the invention includes a first electrode 28 comprising a cylindrical portion 56. First electrode 28 may be considered as having an elevationally innermost base surface 58. Dielectric material 32 comprises a cylindrical portion 60 that is longitudinally over cylindrical portion 56 of first electrode 28. In one embodiment and as shown, cylindrical portion 60 of dielectric material 32 is directly against cylindrical portion 56 of first electrode 28. Regardless, the embodiment of FIGS. 12 and 13 shows example cylindrical portion 60 as tapering elevationally and radially inward. However, other constructions may be used. For example elevationally outward and/or radially outward tapering (not shown), or non-tapering cylindrical portions (not shown), may be used and regardless of the configuration of cylindrical portion 56 of first electrode 28.

Heater material 36 is radially inward of and electrically coupled to cylindrical portion 56 of first electrode 28. In one embodiment, heater material 36 is also radially inward of dielectric material 32. In one embodiment, the heater material is directly against cylindrical portion 56 of first electrode 28, and in one embodiment is directly against cylindrical portion 60 of dielectric material 32. In one embodiment, cylindrical portion 56 of first electrode 28 encircles heater material 36 along at least a longitudinal portion of heater material 36, and in one embodiment along at least a majority of longitudinal length "L" (FIG. 12) of heater material 36. In one embodiment, heater material 36 completely fills a radially inward void space defined by cylindrical portion 56 of first electrode 28.

Heater material 36 may be considered as having an elevationally outermost surface 64 and an elevationally innermost surface 66. Cylindrical portion 60 of dielectric material 32 may be considered as having an elevationally outermost surface 68. In one embodiment, surface 68 is elevationally coincident with surface 64, for example as shown. In one embodiment, heater material 36 is everywhere elevationally outward of first electrode base surface 58. In one embodiment, elevationally outermost surface 64 of heater material 32 is wider than its elevationally innermost surface 66. In one embodiment, first electrode 28 and dielectric material 32 in combination is generally V-shaped in vertical cross-section, for example as shown. In one embodiment, heater material 36 fills the general V-shape.

Phase change material 38 is over heater material 36 and a second electrode 43 is electrically coupled to phase change material 38. In one embodiment, phase change material 38 is directly against heater material 36 and in one embodiment second electrode 43 is directly against phase change material 38. In one embodiment, phase change material is directly against the heater material at an elevationally outermost contact surface (e.g., surface 64) that is smaller than elevationally innermost base surface 58 of first electrode 28. In one embodiment, the phase change memory cell has a contact area between the phase change material and the heater material of no greater than about 2,000 square nanometers, and in one embodiment no greater than about 700 square nanometers. In one embodiment, the phase change memory cell has a first contact area between the phase change material and the heater material of no greater than about 2,000 square nanometers, and has a second contact area between the phase change material and at least one of the first and second electrodes that is at least ten times greater than the first contact area.

Any other one or more than one of the attributes as described above with the method embodiments may be incorporated in the structure embodiments of the invention. Analogously, any of the structural aspects may be incorporated in the above methodical aspects.

Figure 16:
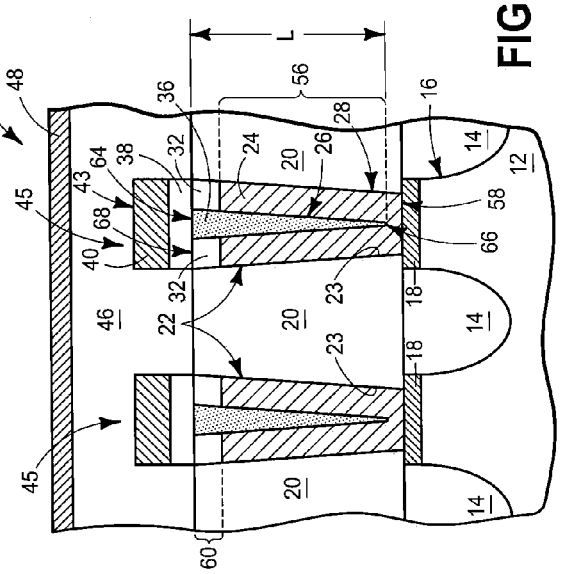
FIG. 16 is a diagrammatic structural cross-section view of a substrate fragment in accordance with an embodiment of the invention.

The embodiments depicted in FIGS. 12-15 show heater material 36 being everywhere elevationally outward of first electrode base surface 58. FIG. 16 shows an alternate example memory cell 45a. Like numerals from the above described embodiments have been used where appropriate, with some construction differences being indicated with the suffix "a". Heater material 36a in memory cell 45a extends elevationally inward at least to base surface 58 of first electrode 28a.

CONCLUSION

In some embodiments, a method of forming a memory cell comprising first and second electrodes having phase change material and heater material therebetween comprises lining inner sidewalls of an opening with conductive material to comprise the first electrode of the memory cell. Outer sidewalls of the opening are lined with dielectric material. Heater material is formed in the opening laterally inward of and electrically coupled to the conductive material in the opening. Phase change material is formed over the heater material and conductive second electrode material is formed that is electrically coupled to the phase change material.

In some embodiments, a method of forming a memory cell comprising first and second electrodes having phase change material and heater material therebetween comprises partially filling an opening in an insulator material with conductive material to comprise the first electrode of the memory cell. Remaining volume of the opening is partially filled with dielectric material over the conductive material. After the partially filling with the dielectric material, heater material is formed in the opening directly against the conductive material in the opening and directly against the dielectric material in the opening. Phase change material is formed over the heater material and conductive second electrode material is formed that is electrically coupled to the phase change material.

In some embodiments, a method of forming a memory cell comprising first and second electrodes having phase change material and heater material therebetween comprises lining sidewalls of a first opening in insulator material with conductive material to comprise the first electrode of the memory cell. The conductive material forms a second opening within the first opening. The conductive material is longitudinally recessed within the first opening. Dielectric material is deposited to line sidewalls of the first opening longitudinally outward of the recessed conductive material and to occlude remaining of the second opening in the recessed conductive material. The dielectric material in the first opening is removed to uncover remaining of the second opening and leave the dielectric material in the first opening longitudinally over the recessed conductive material. After removing the dielectric material, heater material is deposited into the first opening radially inward of the dielectric material and into remaining of the second opening radially inward of and electrically coupled to the conductive material in the first opening. Phase change material is formed over the heater material and conductive second electrode material is formed that is electrically coupled to the phase change material.

In some embodiments, a method of forming a memory cell comprising first and second electrodes having phase change material and heater material therebetween comprises circumferentially self-aligning the heater material within an opening within the first electrode. Phase change material is formed over the heater material. Conductive second electrode material is formed that is electrically coupled to the phase change material.

In some embodiments, a phase change memory cell comprises a first electrode comprising a cylindrical portion. Dielectric material comprising a cylindrical portion is longitudinally over the cylindrical portion of the first electrode. Heater material is radially inward of and electrically coupled to the cylindrical portion of the first electrode. Phase change material is over the heater material and a second electrode is electrically coupled to the phase change material.

In some embodiments, a phase change memory cell comprises a first electrode comprising a cylindrical portion. Dielectric material comprising a cylindrical portion is longitudinally over and directly against the cylindrical portion of the first electrode. Heater material is directly against the cylindrical portions of the first electrode and the dielectric material radially inward of the cylindrical portions of the first electrode and the dielectric material. Phase change material is directly against the heater material and a second electrode is electrically coupled to the phase change material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A phase change memory cell comprising:
a first electrode comprising a cylindrical portion;
dielectric material comprising a cylindrical portion longitudinally over the cylindrical portion of the first electrode;
heater material radially inward of and laterally over a lateral inner sidewall of the conductive material, the heater material being electrically coupled to the cylindrical portion of the first electrode; and
phase change material over the heater material and a second electrode electrically coupled to the phase change material.

2. The phase change memory cell of claim 1 wherein the cylindrical portion of the first electrode completely encircles the heater material along at least a longitudinal portion of the heater material.

3. The phase change memory cell of claim 2 wherein the heater material completely fills a radially internal void space defined by the cylindrical portion of the first electrode.

4. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode, the heater material being directly against the cylindrical portion of the first electrode; and
phase change material over the heater material and a second electrode electrically coupled to the phase change material.

5. The phase change memory cell of claim 1 wherein the heater material is radially inward of the dielectric material.

6. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode, the heater material being directly against the dielectric material; and
phase change material over the heater material and a second electrode electrically coupled to the phase change material.

7. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material; and
the cylindrical portion of the dielectric material having an elevationally outermost surface which is elevationally coincident with an elevationally outermost surface of the heater material.

8. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode; and
phase change material over the heater material and a second electrode electrically coupled to the phase change material, the phase change material being directly against the heater material.

9. The phase change memory cell of claim 8 wherein the phase change material is directly against the heater material at an elevationally outermost contact surface that is smaller than an elevationally innermost base surface of the first electrode.

10. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material; and
the first electrode having an elevationally innermost base surface, the heater material being everywhere elevationally outward of the elevationally innermost base surface of the first electrode.

11. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material; and
the first electrode having an elevationally innermost base surface, the heater material extending elevationally inward at least to the elevationally innermost base surface of the first electrode.

12. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material; and
the heater material having an elevationally outermost surface and an elevationally innermost surface, the outermost surface being wider than the innermost surface.

13. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material; and
a contact area between the phase change material and the heater material of no greater than about 2,000 square nanometers.

14. The phase change memory cell of claim 13 wherein the contact area is no greater than about 700 square nanometers.

15. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material; and
a first contact area between the phase change material and the heater material of no greater than about 2,000 square nanometers, and having a second contact area between the phase change material and at least one of the first and second electrodes that is at least ten times greater than the first contact area.

16. The phase change memory cell of claim 15 wherein the first contact area is no greater than about 700 square nanometers.

17. A phase change memory cell comprising:
a first electrode comprising a cylindrical portion;
dielectric material comprising a cylindrical portion longitudinally over and directly against the cylindrical portion of the first electrode;
heater material directly against the cylindrical portions of the first electrode and the dielectric material radially inward of the cylindrical portions of the first electrode and the dielectric material; and
phase change material directly against the heater material and a second electrode electrically coupled to the phase change material.

18. The phase change memory cell of claim 17 wherein the heater material has an elevationally outermost surface and the first electrode has an elevationally innermost base surface, the elevationally outermost surface of the heater material being smaller than the elevationally innermost base surface of the first electrode.

19. The phase change memory cell of claim 17 wherein the first electrode and the dielectric material in combination is generally V-shaped in a vertical cross section.

20. The phase change memory cell of claim 19 wherein the heater material fills the general V-shape.

21. A phase change memory cell comprising:
a first electrode comprising a cylindrical portion;
dielectric material comprising a cylindrical portion longitudinally over the cylindrical portion of the first electrode;
heater material radially inward of and electrically coupled to the cylindrical portion of the first electrode;
phase change material over the heater material and a second electrode electrically coupled to the phase change material;
the cylindrical portion of the first electrode completely encircling the heater material along at least a longitudinal portion of the heater material; and
all material radially inward of the cylindrical portion of the first electrode consists essentially of the heater material.

22. The phase change memory cell of claim 6 wherein all material radially inward of the dielectric material consists essentially of the heater material.

* * * * *